(12) United States Patent
Balasubramanian et al.

(10) Patent No.: US 11,888,391 B2
(45) Date of Patent: Jan. 30, 2024

(54) GATE DRIVER CIRCUIT WITH CHARGE PUMP CURRENT CONTROL

(71) Applicant: TEXAS INSTRUMENTS INCORPORATED, Dallas, TX (US)

(72) Inventors: Shyamsunder Balasubramanian, Plano, TX (US); Kuangyu Chiang, Plano, TX (US); Toshio Yamanaka, Plano, TX (US); Luis Eduardo Ossa, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 128 days.

(21) Appl. No.: 17/489,233

(22) Filed: Sep. 29, 2021

(65) Prior Publication Data

US 2023/0100060 A1 Mar. 30, 2023

(51) Int. Cl.
*H02M 1/08* (2006.01)
*H02M 3/07* (2006.01)
*H03K 17/06* (2006.01)
*H02M 1/32* (2007.01)

(52) U.S. Cl.
CPC ............... *H02M 3/07* (2013.01); *H02M 1/08* (2013.01); *H02M 1/32* (2013.01); *H03K 17/063* (2013.01); *H03K 2217/0081* (2013.01)

(58) Field of Classification Search
CPC ............ H02M 1/08; H02M 1/32; H02M 3/07; H03K 17/06; H03K 17/063; H03K 2217/0081

USPC .......................................... 327/108, 109, 110
See application file for complete search history.

(56) References Cited

U.S. PATENT DOCUMENTS

| | | | | |
|---|---|---|---|---|
| 2004/0080963 | A1* | 4/2004 | Grant .................. | H02M 3/1588 363/59 |
| 2012/0293219 | A1* | 11/2012 | Bai ...................... | H02M 3/1588 327/109 |
| 2013/0241621 | A1* | 9/2013 | Forghani-Zadeh ......................... | H03K 17/08122 327/315 |
| 2014/0062449 | A1* | 3/2014 | Qu ............................ | G05F 3/02 323/311 |

* cited by examiner

*Primary Examiner* — William Hernandez
(74) *Attorney, Agent, or Firm* — Valerie M. Davis; Frank D. Cimino

(57) ABSTRACT

A device includes a charge pump configured to provide a current to a bootstrap capacitor responsive to a charge pump switch being closed. The device also includes a current limiter coupled in series between the charge pump switch and the charge pump. The current limiter is configured to receive a control signal from a controller that indicates whether the device is to operate in a first mode or in a second mode; responsive to the control signal indicating the first mode, allow a first value of current to the charge pump switch; and, responsive to the control signal indicating the second mode, limit the current to the charge pump switch to a second value. The second value is less than the first value.

23 Claims, 4 Drawing Sheets

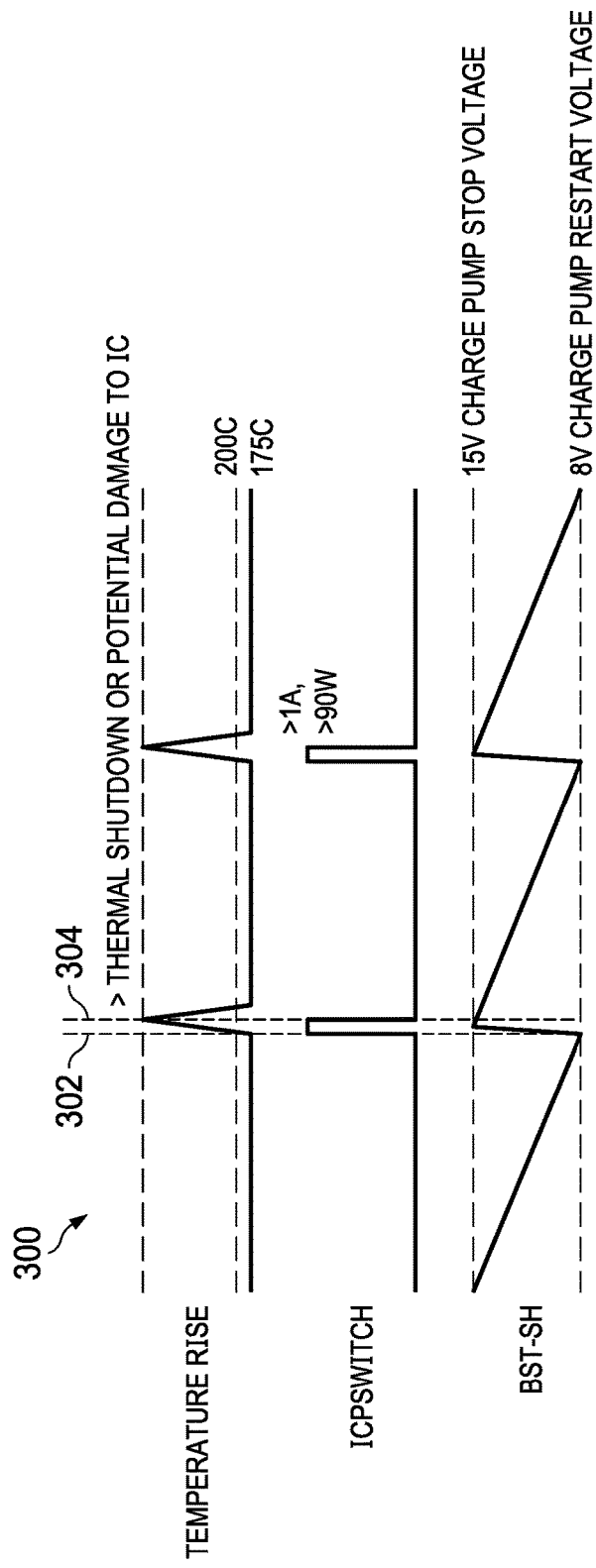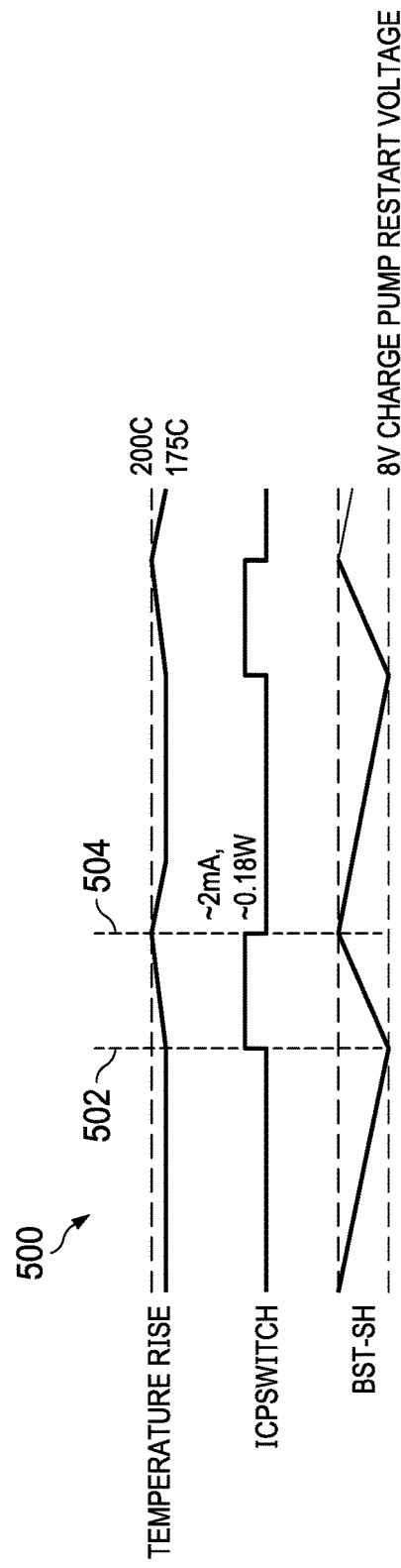

GATE DRIVER CIRCUIT WITH CHARGE PUMP CURRENT CONTROL

CROSS-REFERENCE TO RELATED APPLICATIONS

The present application relates to co-pending U.S. patent application Ser. No. 17/489,233, which was filed Sep. 29, 2021, is titled "PEAK CURRENT REGULATION FOR STEPPER MOTORS," and is hereby incorporated herein by reference in its entirety.

BACKGROUND

An electric motor converts electrical energy into mechanical energy. In some cases, electric motors draw large currents (e.g., greater than 100 amps (A)) to operate. Power field-effect transistors (FETs) are useful to drive these large currents to an electric motor. A gate driver circuit controls operation of the power FETs. For example, the gate driver circuit includes multiple gate drivers that are configured to drive a power FET (e.g., provide a voltage to a gate of the power FET) to turn the power FET on or to turn the power FET off.

SUMMARY

In an example of the description, a device includes a charge pump configured to provide a current to a bootstrap capacitor responsive to a charge pump switch being closed. The device also includes a current limiter coupled in series between the charge pump switch and the charge pump. The current limiter is configured to receive a control signal from a controller that indicates whether the device is to operate in a first mode or in a second mode; responsive to the control signal indicating the first mode, allow a first value of current to the charge pump switch; and, responsive to the control signal indicating the second mode, limit the current to the charge pump switch to a second value. The second value is less than the first value.

In another example of the description, a method includes providing a current from a charge pump, to a bootstrap capacitor, through a charge pump switch; receiving a control signal that indicates a first mode of operation or a second mode of operation; responsive to the control signal indicating the first mode, allowing a first value of current to the charge pump switch; and, responsive to the control signal indicating the second mode, limiting the current to the charge pump switch to a second value. The second value is less than the first value.

In yet another example of the description, a system is operable to drive an electric motor. The system includes a transistor pair, including a high-side transistor and a low-side transistor. The transistor pair is coupled to the electric motor. The system also includes a gate driver circuit coupled to the transistor pair. The gate driver circuit includes a charge pump coupled to a bootstrap capacitor and operable to supply a current having a first value to the bootstrap capacitor; a charge pump switch coupled between the charge pump and the bootstrap capacitor; and a current limiter coupled between the charge pump switch and the charge pump. The current limiter is operable to limit current through the charge pump switch to a value less than the first value responsive to a control signal.

BRIEF DESCRIPTION OF THE DRAWINGS

FIG. 3 is a graph of waveforms illustrating operation of the gate driver circuit of FIG. 2 in an example.

FIG. 5 is a graph of waveforms illustrating operation of the gate driver circuit of FIG. 4 in an example.

The same reference numbers and other reference designators are used in the drawings to designate the same or similar (functionally and/or structurally) features.

DETAILED DESCRIPTION

Figure 1:
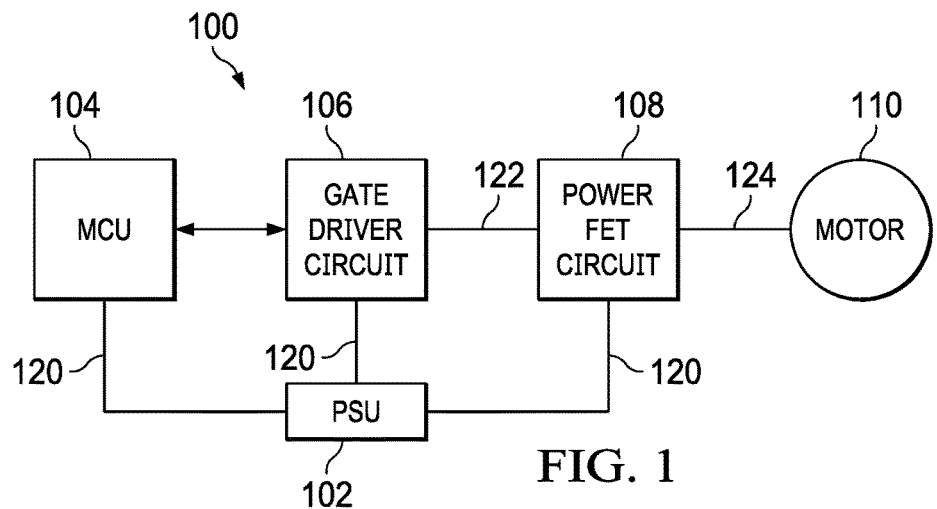
FIG. 1 is a block diagram of a system including a gate driver circuit with charge pump current control in an example.

Conventionally, a high-side FET is coupled to a voltage supply terminal (e.g., a power supply such as a battery) and to a switched voltage phase node, while a low-side FET is coupled to the switched voltage phase node and a ground terminal. The gate driver circuit is configured to control the operation of the power FETs in one of at least two modes: a switching mode and a high-impedance (or "Hi-Z") mode. In the switching mode, during a first phase, the high-side FET is on and the low-side FET is off; during a second phase, the high-side FET is off and the low-side FET is on. In the Hi-Z mode, both the high-side FET and the low-side FET remain off, and the power FETs do not provide current to the motor.

The power FETs are designed to have a low resistance when on, which is enabled by driving a gate of the power FET to a higher voltage than a source of the power FET. Because the source of the low-side FET is coupled to the ground terminal, the low-side FET is "on" (e.g., conducting) responsive to the gate of the low-side FET being driven to a voltage greater than ground, which is readily achievable. However, when the high-side FET is "on" (e.g., conducting), the voltage at the switched voltage phase node, which is coupled to the source of the high-side FET, will be approximately equal to the voltage at the supply terminal. Accordingly, the high-side FET is on responsive to the gate of the high-side FET being driven to a voltage greater than the supply voltage.

A bootstrap capacitor may be provided, to enable the gate driver for the high-side FET to provide a gate voltage that is greater than the supply voltage. A charge pump is useful to maintain a charge of the bootstrap capacitor. However, in certain applications, the charge pump is designed to be relatively strong (e.g., configured to provide a relatively high current to the bootstrap capacitor, such as 1 A or more), and provides current to the bootstrap capacitor through a charge pump switch (e.g., a transistor) to charge the bootstrap capacitor.

In the switching mode, an amount of power dissipated by the charge pump switch is relatively small, because although the current through the charge pump switch can be on the order of 1 A, the voltage across the charge pump switch is relatively small. Accordingly, in the switching mode, the power dissipated by the charge pump switch, and associated thermal rise are within acceptable ranges for various applications. In the Hi-Z mode, it is useful to maintain a voltage across the bootstrap capacitor (e.g., a voltage within a range) while the power FETs are not switching, because the bootstrap capacitor is then sufficiently charged for a subsequent transition to the switching mode. Also, while in the Hi-Z mode and irrespective of the voltage across the bootstrap capacitor, the voltage at the switched voltage phase node can be in a range from approximately ground to approximately the supply voltage. In one case, the voltage at the switched voltage phase node is relatively closer to ground, and the charge pump is turned on to charge the bootstrap capacitor (e.g., the charge pump switch is closed). In this case, the charge pump switch dissipates a relatively large amount of power because of the ability of the charge pump to supply higher currents, and the larger voltage drop from the charge pump to the bootstrap capacitor. Accordingly, temperature sensing circuitry of the gate driver circuit can be tripped (e.g., triggering a fault) because of the increased temperature that results from the increased power dissipated by the charge pump switch. In certain cases, the gate driver circuit can be damaged because of such increased temperature rise.

Examples of the present description address the foregoing by providing a mode-dependent current limiter in series with the charge pump switch. The current limiter is configured to receive a control signal, such as from a microcontroller (MCU) of a control system for the gate driver circuit and the power FET circuit. The control signal indicates at least whether the gate driver circuit operates in the switching mode or in the Hi-Z mode. The current limiter is configured to be in a low-impedance configuration responsive to the control signal indicating that the gate driver circuit is operating in the switching mode. The current limiter is configured to be in a current-limiting configuration responsive to the control signal indicating that the gate driver circuit is operating in the Hi-Z mode.

In the low-impedance configuration, the current limiter can behave as a closed switch, which enables the charge pump to charge the bootstrap capacitor at a first current value. In the current-limiting configuration, the current limiter functions to limit the current flowing from the charge pump to the bootstrap capacitor (e.g., also through the charge pump switch) to a second current value, which is less than the first current value. By limiting current through the charge pump switch in the Hi-Z mode, the power dissipated by the charge pump switch is limited or reduced, which in turn limits the amount of temperature rise responsive to that power dissipation. Accordingly, temperature fault triggering and damage to the gate driver circuit can be reduced and/or eliminated. These examples are described below, with reference made to the accompanying figures.

FIG. 1 is a block diagram of a system 100 in an example of this description. The system 100 includes a power supply unit (PSU) 102, an MCU 104, a gate driver circuit 106, a power FET circuit 108, and a motor 110. In an example, the system 100 is configured to control the driving of motor 110. Although the system 100 of FIG. 1 is configured to control the motor 110, in other examples, the system 100 is configured to control devices other than the motor 110, including any type of circuit.

The PSU 102 can be any type of electrical device configured to generate a power supply 120 at a given voltage or voltages (e.g., 12 V, 48 V) to provide electric energy for the remaining components of system 100 (e.g., power FET circuit 108, MCU 104, gate driver circuit 106) to operate. For example, the PSU 102 can be any type of power supply unit including a direct current (DC) power supply unit, an alternating current (AC)-to-DC power supply unit, a linear regulator, an AC power supply unit, a switched-mode power supply unit, an uninterruptible power supply (UPS) unit, a battery, and the like.

The power 120 provided by PSU 102 may be too high to directly power certain components, and thus one or more voltage regulators (not shown for simplicity) are configured to receive the power 120 provided by PSU 102 and generate an output signal (also not shown for simplicity) at a constant voltage to directly power other components of system 100 (e.g., MCU 104 and gate driver circuit 106, which can be integrated on the same integrated circuit). These one or more voltage regulators can include low-dropout (LDO) regulators, DC-DC buck converters, and the like. For example, the voltage regulators may receive power 120 provided by PSU 102 at 12 V and generate output signals to provide power to other components of system 100 at a steady 5-6 V.

The MCU 104 may be configured to implement state changes for the devices of system 100. For example, the MCU 104 can be configured to control the overall operation of the system 100 by implementing state changes for gate driver circuit 106. The MCU 104 may be configured to cause the gate driver circuit 106 to operate in a first state, which corresponds to the switching mode described above, or a second state, which corresponds to the Hi-Z mode described above.

The MCU 104 can include one or more of various microcontrollers, or other electrical processing devices, and can include a processor core, memory, and programmable input/output peripherals. The memory of the MCU 104 can include flash, read-only memory (ROM), random-access memory (RAM), or any other type of memory or combination of types of memory. In some examples, the components of the MCU 104 are implemented as a system on a chip (SoC) on a single integrated circuit. In other examples, the MCU 104 is implemented across multiple integrated circuits.

The gate driver circuit 106 is configured to drive electric motor 110 in response to signals received from MCU 104, such as by operating in either the switching mode or the Hi-Z mode, described above. In other words, the gate driver circuit 106 is configured to drive electric motor 110 responsive to the state changes in the gate driver circuit 106 imposed by control signal(s) from the MCU 104. In some examples, large currents (e.g., hundreds of amps) are useful to drive electric motor 110. Accordingly, power FET circuit 108 is configured to drive the electric motor 110. In some examples, the power FET circuit 108 is not implemented on the same integrated circuit as the MCU 104 and the gate driver circuit 106, but instead in the same package (e.g., part of a multi-chip module including the MCU 104, gate driver circuit 106, and power FET circuit 108).

The gate driver circuit 106 may be configured to drive the gates of power FETs within power FET circuit 108 by generating signal 122 at a drive current (e.g., to turn ON and OFF the power FETs within power FET circuit 108). For example, the gate driver circuit 106 generates signal 122 with a current that has a magnitude sufficient to drive the gates of the power FETs within power FET circuit 108. While shown as a single signal, signal 122 may be multiple signals. For example, gate driver circuit 106 may generate as many drive signals as there are power FETs within power FET circuit 108 (e.g., two signals 122 to drive the gates of two power FETs).

The power FETs within power FET circuit 108 are configured to drive the electric motor 110 with a current to operate the electric motor 110 by generating signal 124. The electric motor 110 can include various types of electric motors, such as a brushless DC electric motor, a stepper motor, and the like. The electric motor 110 may be a three-phase brushless DC motor. In this example, the power FET circuit 108 is configured to drive one of the three phases of the motor 110, and examples described below are replicated to drive the others of the three phases of the motor 110. In some examples, the system 100 is implemented in an automobile application. For example, the system 100 can be utilized to control a power steering motor in an automobile, a mild-hybrid electric motor in an automobile, or various other types of electric motors useful in automobiles. The system 100 can also be implemented in other, non-automotive applications.

Figure 2:
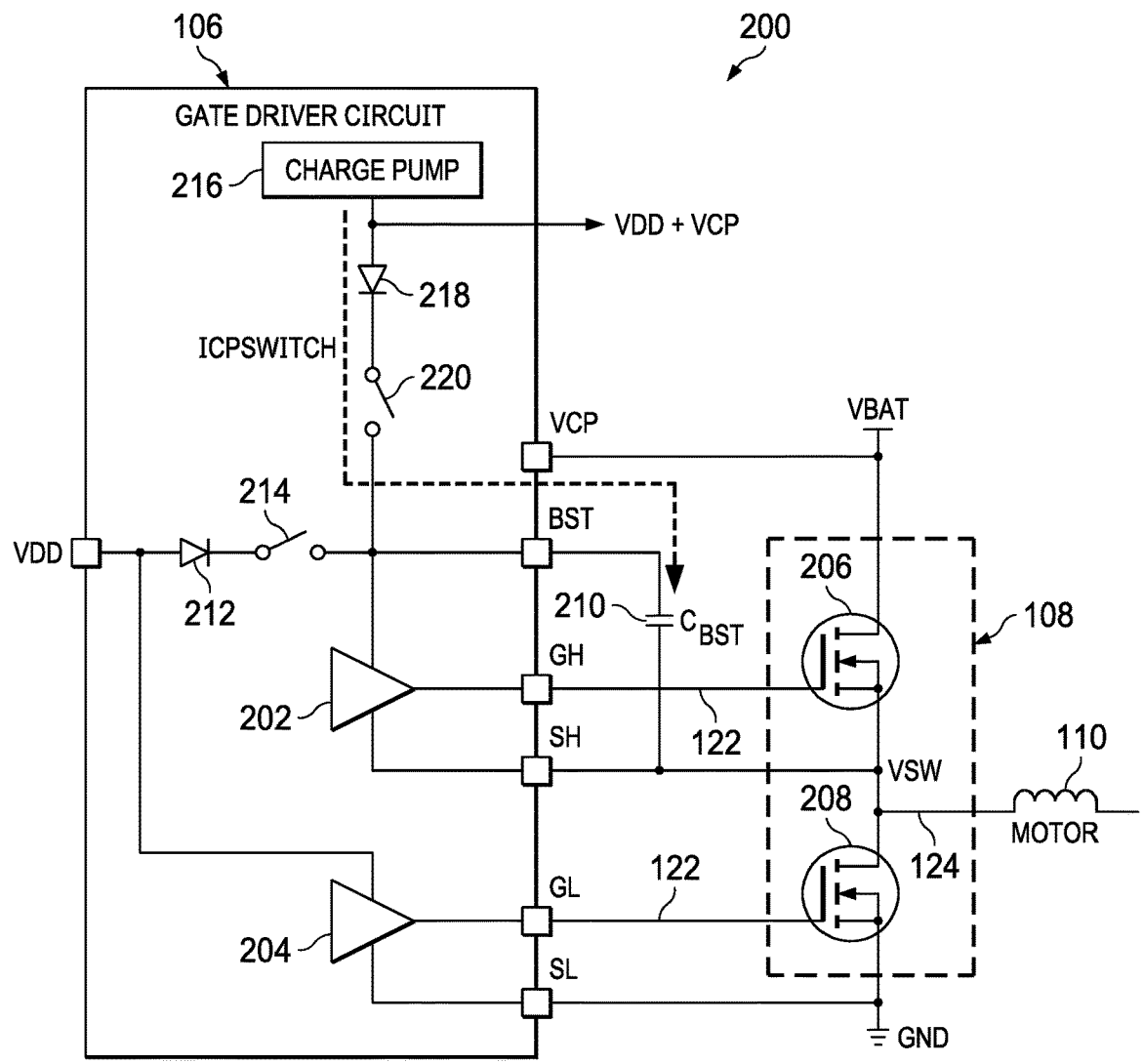
FIG. 2 is a schematic circuit diagram of a gate driver circuit in an example.

FIG. 2 is a schematic circuit diagram of a system 200 including gate driver circuit 106, a power FET circuit 108, and a motor 110 (represented by an inductor 110 in FIG. 2), in an example of this description. The gate driver circuit 106 includes a high-side gate driver 202 and a low-side gate driver 204 (collectively, a gate driver group). The power FET circuit 108 includes a high-side power FET 206 and a low-side power FET 208 (collectively, a power FET group). In other examples, the system 200 includes multiple, similarly-configured gate driver groups and power FET groups (e.g., in other example embodiments, there is a high-side FET/low-side FET pair for each coil used in motor 110 and two gate drivers for each pair of FETs). For example, the system 200 can include three similarly-configured power FET groups each configured to generate a signal 124 to drive a single phase of a three-phase electric motor 110. Continuing this example, there are three gate driver groups each configured to drive the gates of the power FETs included in a single power FET group (e.g., power FETs 206, 208). In alternative embodiments, two high-side FET/low-side FET pairs (configured as an H-bridge) are used for each coil of motor 110.

Irrespective of the number of gate driver groups and/or power FET groups, the high-side power FET 206 is coupled to a voltage supply terminal VBAT (e.g., a power supply such as a battery), and to a switched voltage phase node VSW. The low-side power FET 208 is coupled to VSW and to a ground terminal GND. The motor 110 (or a coil of the motor represented by the inductor 110) is also coupled to VSW, as well as to another motor terminal (not shown for simplicity), such as a common terminal (e.g., to which each coil of a multi-phase motor is coupled). For simplicity, VBAT, VSW, and GND also refer to the voltage at the voltage supply terminal, the switched voltage phase node, and the ground terminal, respectively. The power FETs 206, 208 can each be a FET and, more particularly, can be an n-channel metal-oxide-semiconductor field-effect (NMOS) transistor as shown in FIG. 2. In another example, power FETs 206, 208 can be other types of transistors including a p-channel metal-oxide-semiconductor field-effect (PMOS) transistor, a p-type junction gate field-effect transistor (PJFET), an n-type junction gate field-effect transistor (NJFET), or a bipolar junction transistor (BJT) (including PNP and NPN transistors).

The high-side gate driver 202 is configured to drive a gate (GH) of the high-side power FET 206 (e.g., to control whether the high-side power FET 206 is on or off). The low-side gate driver 204 is configured to drive a gate (GL) of the low-side power FET 208 (e.g., to control whether the low-side power FET 208 is on or off). For simplicity, GH and GL also refer to the voltage at the like-labeled nodes.

In an example, the gate drivers 202, 204 are configured to drive GH and GL, respectively, responsive to signals received from the MCU 104. For example, as described above, the MCU 104 is configured to cause the gate driver circuit 106 to operate in a first state (e.g., by providing a first control signal to the gate driver circuit 106), in which the gate drivers 202, 204 drive the power FETs 206, 208, respectively, to operate in the switching mode described above. Continuing this example, as described above, the MCU 104 is configured to cause the gate driver circuit 106 to operate in a second state (e.g., by providing a second control signal to the gate driver circuit 106), in which the gate drivers 202, 204 drive the power FETs 206, 208, respectively, to operate in the Hi-Z mode described above. The gate drivers 202, 204 of the gate driver circuit 106 are thus configured to control the operation of the power FETs 206, 208, respectively, in one of at least two modes: the switching mode and the Hi-Z mode.

The power FETs 206, 208 are configured to have a low resistance when on, which is enabled by driving a gate of the power FET 206, 208 to a higher voltage than a source of the power FET 206, 208. Because the source (SL) of the low-side power FET 208 is coupled to GND, the low-side power FET 208 is on responsive to GL being driven to a voltage greater than GND (e.g., driven to a voltage greater than the threshold voltage for FET 208), which is readily achievable with a gate driver circuit 106 supply voltage (VDD). For example, VDD can be on the order of 12 V. However, when the high-side power FET 206 is on, VSW, which is coupled to the source (SH) of the high-side power FET 206, will be approximately equal to VBAT, which can be on the order of 48 V in one example. Thus, the high-side gate driver 202 should supply a voltage greater than VBAT (e.g., a voltage greater than VBAT plus the threshold voltage of FET 206) to GH to turn on the high-side power FET 206. For simplicity, SL, SH, and VDD also refer to the voltage at the like-labeled nodes.

The gate driver circuit 106 includes (or is adapted to be coupled to) a bootstrap capacitor 210 to enable the high-side gate driver 202 to provide GH (the voltage at node GH) greater than VBAT. The bootstrap capacitor 210 is coupled to SH and to a supply terminal for the high-side gate driver 202 (BST). The gate driver circuit 106 supply voltage VDD is provided to the bootstrap capacitor 210. For example, a bootstrap diode 212 is coupled to the VDD terminal, and a bootstrap switch 214 (e.g., a transistor) is coupled to the bootstrap diode 212 and to BST (e.g., the bootstrap capacitor 210). The bootstrap diode 212 prevents current from flowing to VDD, and the bootstrap switch 214 selectively couples VDD to BST to charge the bootstrap capacitor 210 from the supply voltage VDD.

For example, in switching mode and while the low-side power FET 208 is on (and thus the high-side power FET 206 is off), the bootstrap switch 214 is closed and the bootstrap capacitor 210 is charged. Subsequently, in switching mode and while the high-side power FET 206 is on (and thus the low-side power FET 208 is off), the bootstrap switch 214 is open. The voltage at BST, the supply terminal for the high-side gate driver 202, is greater than SH by the voltage across the bootstrap capacitor 210. Accordingly, the high-side gate driver 202 drives GH to a voltage greater than SH by the voltage across the bootstrap capacitor 210, which enables the high-side power FET 206 to turn on.

In some cases, the on-time of the low-side power FET 208, and thus the time period during which the bootstrap capacitor 210 is charged by VDD, is relatively short. Accordingly, the gate driver circuit 106 also includes a charge pump 216 that is configured to maintain a charge of the bootstrap capacitor 210. For example, a charge pump diode 218 is coupled to the charge pump 216, and a charge pump switch 220 is coupled to the charge pump diode 218 and to BST (e.g., the bootstrap capacitor 210). The charge pump diode 218 prevents current from flowing to the charge pump 216, and the charge pump switch 220 selectively couples the charge pump 216 to BST to charge the bootstrap capacitor 210 from the charge pump 216 voltage. In an example, the charge pump 216 voltage is on the order of VDD plus VBAT (or VCP), or approximately 60 V using the numerical examples above.

The charge pump switch 220 is configured to be closed during periods in which the high-side power FET 206 is on, to supplement the VDD-based charging of the bootstrap capacitor 210 that occurs during periods in which the high-side power FET 206 is off. The charge pump switch 220 is configured to be open during periods in which the high-side power FET 206 is off, and also in situations in which the on-time of the low-side power FET 208 is sufficiently long to adequately charge the bootstrap capacitor 210. Irrespective of the duration of the on-time for the low-side power FET 208, the charge pump 216 enables the bootstrap capacitor 210 to be charged in parallel (e.g., on an as-needed basis) with supplying its voltage to the high-side gate driver 202 to turn on the high-side power FET 206. As described above, in certain applications, the charge pump 216 is designed to be relatively strong (e.g., configured to provide a relatively high current to the bootstrap capacitor 210, such as 1 A or more).

As described above, in the switching mode, an amount of power dissipated by the charge pump switch 220 is relatively small, because although the current through the charge pump switch 220 (ICPSWITCH) can be on the order of 1 A, the voltage across the charge pump switch 220 is relatively small. For example, the voltage provided by the charge pump 216 is on the order of 60 V, while the voltage at BST while the high-side power FET 206 is on is at least 48 V (e.g., VBAT) and as much as 60 V (e.g., VBAT plus the voltage across bootstrap capacitor 210, which is charged to VDD). Accordingly, in the switching mode, the power dissipated by the charge pump switch 220, and any associated thermal rise, are within acceptable ranges for various applications, and generally are not problematic.

As described above, it is useful to maintain a voltage across the bootstrap capacitor 210 in the Hi-Z mode, because the bootstrap capacitor 210 is then sufficiently charged for a subsequent transition to the switching mode. However, in the Hi-Z mode, VSW (or SH) is "floating," and can be in a range from approximately GND to approximately VBAT. In a case in which VSW is closer to GND, the charge pump switch 220 dissipates a relatively large amount of power responsive to the charge pump 216 being turned on (e.g., to charge the bootstrap capacitor 210). For example, the voltage provided by the charge pump 216 is on the order of 60 V (e.g., VBAT (or VCP) plus VDD), while the voltage at BST can be as low as GND plus a charge pump 216 restart voltage (e.g., a lower threshold voltage across the bootstrap capacitor 210, or BST-SH, which triggers the charge pump switch 220 to close so that the charge pump 216 begins to charge the bootstrap capacitor 210). In one numerical example, described below with respect to FIG. 3, the charge pump 216 restart voltage is 8 V. Accordingly, the voltage at BST (e.g., one side of the charge pump switch 220) can be as low as 8 V (e.g., GND+8 V), while the voltage on the other side of the charge pump switch 220 can be approximately 60 V. This results in a 52 V drop across the charge pump switch 220, and a corresponding amount of power dissipated by the charge pump switch 220. The power dissipated by the charge pump switch 220 results in an increased temperature rise proximate to the charge pump switch 220, which can trip temperature sensing circuitry of the gate driver circuit 106 (e.g., triggering a fault). In certain cases, the gate driver circuit 106 can be damaged because of such increased temperature rise.

FIG. 3 is a graph 300 of waveforms illustrating operation of the gate driver circuit 106 in the Hi-Z mode. In the graph 300, the Temperature Rise waveform corresponds to a temperature proximate to the charge pump switch 220 in degrees Celsius (C) as a function of time; the ICPSWITCH waveform corresponds to a current (A) through the charge pump switch 220 as a function of time, which is also proportional to a power dissipated by the charge pump switch 220; and the BST-SH waveform corresponds to a voltage (V) across the bootstrap capacitor 210 as a function of time.

In this example, a charge pump 216 restart voltage is 8 V (e.g., a lower threshold), and a bootstrap capacitor 210 overcharge voltage (e.g., a charge pump 216 stop voltage) is 15 V (e.g., an upper threshold). The charge pump switch 220 is configured to close responsive to BST-SH being equal to the lower threshold or restart voltage (e.g., at time 302), and the charge pump switch 220 is configured to open responsive to BST-SH being equal to the upper threshold or charge pump 216 stop voltage (e.g., at time 304). Accordingly, the charge pump 216 charges the bootstrap capacitor 210 responsive to the voltage across the bootstrap capacitor 210 reaching the lower threshold (8 V), and continues to charge the bootstrap capacitor 210 until the voltage across the bootstrap capacitor 210 reaches the upper threshold (15 V).

As described above, the charge pump 216 is configured to provide 1 A or more of current through the charge pump switch 220, such as from time 302 to time 304. Further, the voltage across the charge pump switch 220 in Hi-Z mode can be relatively large, and thus the temperature begins to rise at time 302 and peaks at time 304, when the charge pump switch 220 is open. In this example, the power dissipated by the charge pump switch 220 when closed can be on the order of 90 watts (W) or more, while the temperature of the charge pump switch 220 can greatly exceed an upper safe limit of approximately 200 C.

Figure 4:
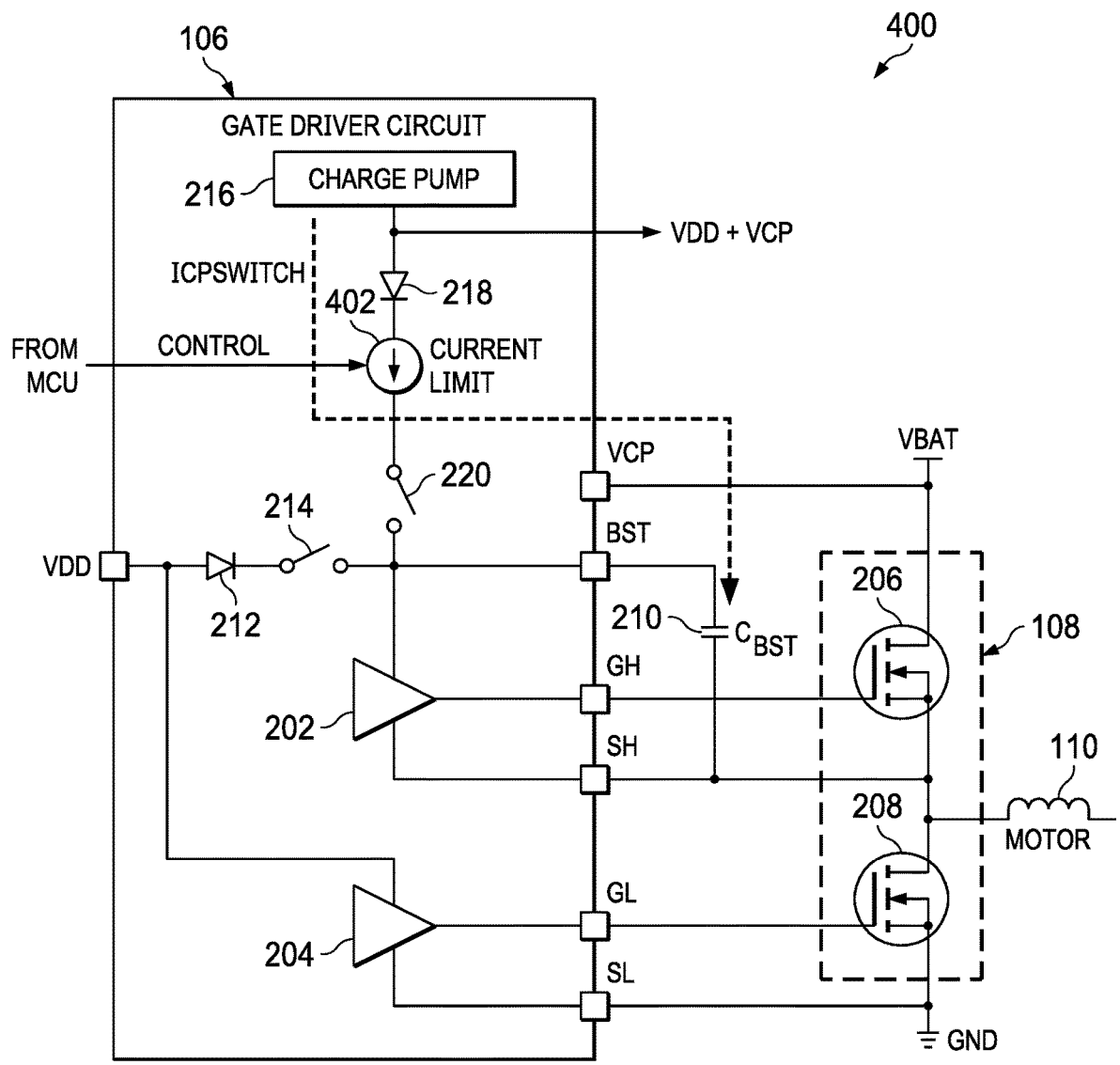
FIG. 4 is a schematic circuit diagram of a gate driver circuit including charge pump current control in an example.

FIG. 4 is a schematic circuit diagram of a system 400 including the gate driver circuit 106, the power FET circuit 108, and the motor 110 (again represented by an inductor 110 in FIG. 4), in an example of this description. Various elements of the gate driver circuit 106 and the power FET circuit 108 are described above with respect to FIG. 2, and those elements are like-numbered in FIG. 4. For brevity, these like-numbered elements function and are arranged as described above with respect to FIG. 2.

In FIG. 4, the gate driver circuit 106 addresses the problems related to power dissipation by (and resulting thermal rise of) the charge pump switch 220, described above. In particular, the gate driver circuit 106 also includes a mode-dependent current limiter 402. The current limiter 402 is in series with the charge pump switch 220. For example, the current limiter 402 is coupled to the charge pump diode 218, and thus is configured to receive a current from the charge pump 216. The current limiter 402 is also coupled to the charge pump switch 220, and thus is configured to provide a current to the charge pump switch 220.

The current limiter 402 is configured to receive a control signal, such as from the MCU 104. For example, as described above, the MCU 104 is configured to cause the gate driver circuit 106 to operate in a first state (e.g., by providing a first control signal to the gate driver circuit 106), in which the gate drivers 202, 204 drive the power FETs 206, 208, respectively, to operate in the switching mode described above. Continuing this example, the MCU 104 is configured to cause the gate driver circuit 106 to operate in a second state (e.g., by providing a second control signal to the gate driver circuit 106), in which the gate drivers 202, 204 drive the power FETs 206, 208, respectively, to operate in the Hi-Z mode described above.

Accordingly, the received control signal indicates at least whether the gate driver circuit 106 operates in the switching mode or in the Hi-Z mode. The current limiter 402 is configured to be in a low-impedance configuration responsive to the control signal indicating that the gate driver circuit 106 is operating in the switching mode. The current limiter 402 is configured to be in a current-limiting configuration responsive to the control signal indicating that the gate driver circuit 106 is operating in the Hi-Z mode.

In the low-impedance configuration, the current limiter 402 is configured as a closed switch, which enables the charge pump 216 to charge the bootstrap capacitor 210 at a first current value (e.g., 1 A or more, in the numerical examples above). In the current-limiting configuration, the current limiter 402 limits the current flowing from the charge pump 216 to the bootstrap capacitor 210 (e.g., also through the charge pump switch 220) to a second current value, which is less than the first current value. By limiting current through the charge pump switch 220 in the Hi-Z mode, the power dissipated by the charge pump switch 220 is limited or reduced, which in turn limits the amount of temperature rise responsive to that power dissipation. Accordingly, temperature fault triggering and damage to the gate driver circuit 106 can be reduced and/or eliminated.

FIG. 5 is a graph 500 of waveforms illustrating operation of the gate driver circuit 106 of FIG. 4, including the current limiter 402, in the Hi-Z mode. In the graph 500, the Temperature Rise waveform corresponds to a temperature proximate to the charge pump switch 220 in degrees Celsius (C) as a function of time; the ICPSWITCH waveform corresponds to a current (A) through the charge pump switch 220 as a function of time, which is also proportional to a power dissipated by the charge pump switch 220; and the BST-SH waveform corresponds to a voltage (V) across the bootstrap capacitor 210 as a function of time.

In this example, a charge pump 216 restart voltage is 8 V (e.g., a lower threshold). In this example, the charge pump switch 220 is configured to open responsive to the temperature proximate to the charge pump switch 220 being greater than an upper threshold (e.g., 200 C). The charge pump switch 220 is configured to close responsive to BST-SH being equal to the lower threshold or restart voltage (e.g., at time 502). The relatively slower rise time of the bootstrap capacitor 210 voltage enables the charge pump switch 220 to open responsive to the proximate temperature being greater than the upper threshold, which occurs before the bootstrap capacitor 210 reaches the charge pump 216 stop voltage. Accordingly, unlike the example of FIG. 3, the charge pump 216 stop voltage (or upper threshold) is not shown in the graph 500. Thus, the charge pump switch 220 opens at time 504, responsive to the proximate temperature being greater than (or reaching) 200C. The charge pump 216 charges the bootstrap capacitor 210 responsive to the voltage across the bootstrap capacitor 210 reaching the lower threshold (8 V), and continues to charge the bootstrap capacitor 210 until the voltage across the bootstrap capacitor 210 reaches the upper threshold (15 V), or the temperature proximate to the charge pump switch 220 is equal to or greater than the upper threshold (200 C), the latter of which is the case in FIG. 5.

As described above, the charge pump 216 is configured to provide 1 A or more of current through the charge pump switch 220. However, in the Hi-Z mode, the current limiter 402 is configured to be in a current-limiting configuration (e.g., responsive to a control signal indicating that the gate driver circuit 106 is operating in the Hi-Z mode). In the current-limiting configuration, the current limiter 402 limits the current flowing from the charge pump 216 to the bootstrap capacitor 210 (e.g., also through the charge pump switch 220) to less than the 1 A of current provided by the charge pump 216 in the switching mode. In some alternative embodiments, the current limit can be set based on system feedback, user-defined criteria, system criteria or it may be set after device manufacture and/or device testing. In the example of FIG. 5, the current limiter 402 limits the current flowing from the charge pump 216, and thus through the charge pump switch 220, to approximately 2 milliamps (mA).

Between the time 502 and the time 504, the charge pump switch 220 is closed as described above. However, because the current limiter 402 limits the current through the charge pump switch 220 in the Hi-Z mode, the power dissipated by the charge pump switch 220 is limited or reduced. The temperature rise from time 502 to time 504 is reduced relative to the temperature rise in graph 300. In this example, the power dissipated by the charge pump switch 220 when closed can be on the order of 0.18 W, while the temperature of the charge pump switch 220 does not exceed its upper safe limit of approximately 200 C. Accordingly, temperature fault triggering and damage to the gate driver circuit 106 can be reduced and/or eliminated.

Figure 6:
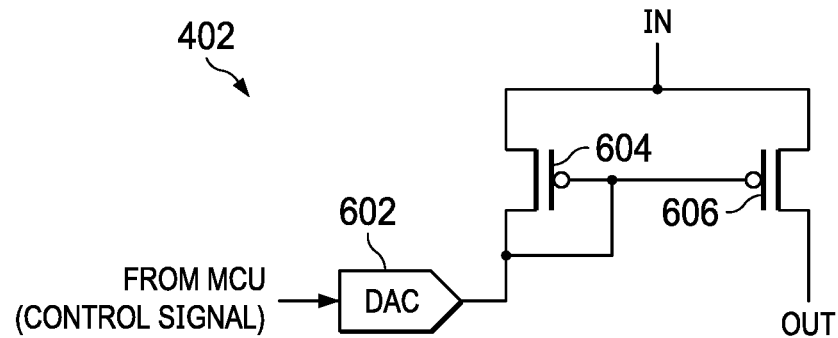
FIG. 6 is a schematic circuit diagram of a current limiting circuit in an example.

FIG. 6 is a schematic circuit diagram of the current limiter 402 in an example. The IN node of the current limiter 402 is coupled to the charge pump 216 (or to the charge pump diode 218) and the OUT node of the current limiter 402 is coupled to the charge pump switch 220. The current limiter 402 includes a digital-to-analog converter (DAC) 602 that has an input configured to receive the control signal (e.g., a digital value from the MCU 104). The DAC 602 is configured to provide an analog value (e.g., a voltage) at its output responsive to the control signal. In the example of FIG. 6, the current limiter 402 also includes a first transistor 604 and a second transistor 606. In this example, the first and second transistors 604, 606 are p-type metal-oxide-semiconductor field-effect transistors.

The first transistor 604 has a source (e.g., a first terminal) coupled to the charge pump 216 (or to the charge pump diode 218), a drain (e.g., a second terminal) coupled to the DAC 602 output, and a gate (e.g., a control terminal) also coupled to the DAC 602 output. The second transistor 606 has a source (e.g., a first terminal) coupled to the charge pump 216 (or to the charge pump diode 218), a drain (e.g., a second terminal) coupled to the charge pump switch 220, and a gate (e.g., a control terminal) coupled to the gate of the first transistor 604 and to the DAC 602 output.

As described, the current limiter 402 receives the control signal, which indicates whether the gate driver circuit 106 operates in the switching mode (e.g., responsive to the control signal being a first digital value) or in the Hi-Z mode (responsive to the control signal being a second digital value). The current limiter 402 is configured to be in a low-impedance configuration responsive to the control signal being the first digital value, and is configured to be in a current-limiting configuration responsive to the control signal being the second digital value. For example, the first digital value is less than the second digital value. In some cases, the control signal is a binary value (e.g., a '0' to indicate that the gate driver circuit 106 is operating in the switching mode and a '1' to indicate that the gate driver circuit 106 is operating in the Hi-Z mode).

Regardless of the particular digital value, the DAC 602 provides a lower analog voltage at its output responsive to receiving a lower digital value at its input, and provides a higher analog voltage at its output responsive to receiving a higher digital value at its input. In some examples, the DAC 602 is implemented such that the lower analog voltage (e.g., provided responsive to the first digital value) is sufficiently low to cause the first transistor 604 to turn fully on (e.g., because of a sufficiently high gate-to-source voltage (VGS)), and the second transistor 606 to be fully on, or conducting. Accordingly, the current limiter 402 is in a low-impedance configuration responsive to the control signal being the first digital value, because the second transistor 606 does not substantially limit the current from the charge pump 216 through the charge pump switch 220.

In these examples, the DAC 602 is implemented such that the higher analog voltage (e.g., provided responsive to the second digital value) is sufficiently high to cause the first transistor 604 to turn partially on (e.g., because of a lower VGS than when the DAC 602 output is the lower analog voltage), and to cause the second transistor 606 to be only partially on, and thus limit the source-to-drain current through the second transistor 606. Accordingly, the current limiter 402 is in a current-limiting configuration responsive to the control signal being the second digital value, because the second transistor 606 limits the current from the charge pump 216 through the charge pump switch 220. In various examples, the DAC 602 and the first and second transistors 604, 606 are designed to achieve a particular current limit responsive to the control signal indicating that the gate driver circuit 106 is operating in the Hi-Z mode, and the 2 mA value in FIG. 5 above is one example of such a current limit.

Figure 7:
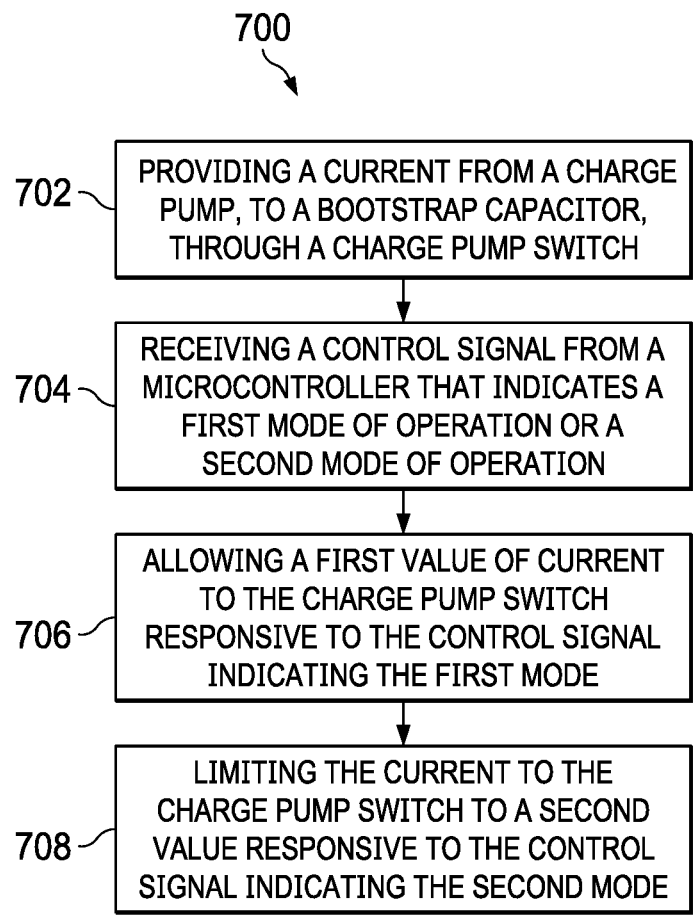
FIG. 7 is a flow chart of a method for charge pump current control in an example.

FIG. 7 is a flow chart of a method 700 for charge pump current control in an example. The method 700 begins in block 702 with providing a current from a charge pump, to a bootstrap capacitor, through a charge pump switch. As explained above, the charge pump 216 provides current to the bootstrap capacitor 210 to maintain a charge of the bootstrap capacitor 210.

The method 700 continues in block 704 with receiving a control signal from a microcontroller that indicates a first mode of operation or a second mode of operation. As explained, the MCU 104 is configured to provide a control signal to the gate driver circuit 106 to cause the gate driver circuit 106 to operate in the switching mode or the Hi-Z mode.

The method 700 then continues in block 706 with allowing a first value of current to the charge pump switch responsive to the control signal indicating the first mode. For example, the current limiter 402 is configured to operate in a low-impedance configuration responsive to the control signal from the MCU 104 indicating that the gate driver circuit 106 is operating in the switching mode.

The method 700 continues in block 708 with limiting the current to the charge pump switch to a second value responsive to the control signal indicating the second mode. The second value of current is less than the first value. For example, the current limiter 402 is configured to operate in a current-limiting configuration responsive to the control signal from the MCU 104 indicating that the gate driver circuit 106 is operating in the Hi-Z mode.

By limiting current through the charge pump switch 220 in the Hi-Z mode, the power dissipated by the charge pump switch 220 is limited or reduced, which in turn limits the amount of temperature rise responsive to that power dissipation. Accordingly, temperature fault triggering and damage to the gate driver circuit 106 can be reduced and/or eliminated.

The term "couple" is used throughout the specification. The term may cover connections, communications, or signal paths that enable a functional relationship consistent with this description. For example, if device A generates a signal to control device B to perform an action, in a first example device A is coupled to device B, or in a second example device A is coupled to device B through intervening component C if intervening component C does not substantially alter the functional relationship between device A and device B such that device B is controlled by device A via the control signal generated by device A.

A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

While certain components may be described herein as being of a particular process technology, these components may be exchanged for components of other process technologies. Circuits described herein are reconfigurable to include the replaced components to provide functionality at least partially similar to functionality available prior to the component replacement. Components shown as resistors, unless otherwise stated, are generally representative of any one or more elements coupled in series and/or parallel to provide an amount of impedance represented by the shown resistor. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor.

As used herein, the terms "terminal," "node," "interconnection," "pin" and "lead" are used interchangeably. Unless specifically stated to the contrary, these terms are generally used to mean an interconnection between or a terminus of a device element, a circuit element, an integrated circuit, a device or other electronics or semiconductor component.

While the use of particular transistors are described herein, other transistors (or equivalent devices) may be used instead with little or no change to the remaining circuitry. For example, a metal-oxide-silicon FET ("MOSFET") (such as an n-channel MOSFET, nMOSFET, or a p-channel MOSFET, pMOSFET), a bipolar junction transistor (BJT—e.g., NPN or PNP), insulated gate bipolar transistors (IGBTs), and/or junction field effect transistor (JFET) may be used in place of or in conjunction with the devices disclosed herein. The transistors may be depletion mode devices, drain-extended devices, enhancement mode devices, natural transistors or other type of device structure transistors. Furthermore, the devices may be implemented in/over a silicon substrate (Si), a silicon carbide substrate (SiC), a gallium nitride substrate (GaN) or a gallium arsenide substrate (GaAs).

While some example embodiments suggest that certain elements are included in an integrated circuit while other elements are external to the integrated circuit, in other example embodiments, additional or fewer features may be incorporated into the integrated circuit. In addition, some or all of the features illustrated as being external to the integrated circuit may be included in the integrated circuit and/or some features illustrated as being internal to the integrated circuit may be incorporated outside of the integrated. As used herein, the term "integrated circuit" means one or more circuits that are: (i) incorporated in/over a semiconductor substrate; (ii) incorporated in a single semiconductor package; (iii) incorporated into the same module; and/or (iv) incorporated in/on the same printed circuit board.

Uses of the phrase "ground voltage potential" in the foregoing description include a chassis ground, an Earth ground, a floating ground, a virtual ground, a digital ground, a common ground, and/or any other form of ground connection applicable to, or suitable for, the teachings of this description. Unless otherwise stated, "about," "approximately," or "substantially" preceding a value means+/−10 percent of the stated value. Modifications are possible in the described examples, and other examples are possible within the scope of the claims.

What is claimed is:

1. A device, comprising:
 a charge pump configured to provide a current to a bootstrap capacitor responsive to a charge pump switch being closed; and
 a current limiter coupled in series between the charge pump switch and the charge pump, wherein the current limiter is configured to:
  receive a control signal from a controller that indicates whether the device is to operate in a first mode or in a second mode;
  responsive to the control signal indicating the first mode, allow a first value of current to the charge pump switch; and
  responsive to the control signal indicating the second mode, limit the current to the charge pump switch to a second value, wherein the second value is less than the first value.

2. The device of claim 1, comprising:
 a high-side gate driver configured to drive a gate of a high-side transistor, wherein the high-side gate driver includes a supply terminal adapted to be coupled to the bootstrap capacitor; and
 a low-side gate driver configured to drive a gate of a low-side transistor.

3. The device of claim 2, wherein, responsive to the control signal indicating the first mode:
 during a first phase:
  the high-side gate driver is configured to drive the gate of the high-side transistor to be on; and
  the low-side gate driver is configured to drive the gate of the low-side transistor to be off; and
 during a second phase:
  the high-side gate driver is configured to drive the gate of the high-side transistor to be off; and
  the low-side gate driver is configured to drive the gate of the low-side transistor to be on.

4. The device of claim 2, wherein, responsive to the control signal indicating the second mode, the high-side gate driver is configured to drive the gate of the high-side transistor to be off, and the low-side gate driver is configured to drive the gate of the low-side transistor to be off.

5. The device of claim 2, wherein the charge pump switch is configured to close:
 responsive to the high-side gate driver driving the gate of the high-side transistor to be on and the control signal indicating the first mode; or
 a voltage across the bootstrap capacitor being equal to a lower threshold and the control signal indicating the second mode.

6. The device of claim 2, wherein the charge pump switch is configured to open:
 responsive to the high-side gate driver driving the gate of the high-side transistor to be off and the control signal indicating the first mode; or
 a voltage across the bootstrap capacitor being equal to an upper threshold and the control signal indicating the second mode.

7. The device of claim 1, wherein the current limiter includes:
 a digital-to-analog converter (DAC) having an input configured to receive the control signal, wherein the DAC is configured to provide an analog value at an output responsive to the control signal;
 a first transistor having a first terminal coupled to the charge pump, a second terminal coupled to the DAC output, and a control terminal coupled to the DAC output; and
 a second transistor having a first terminal coupled to the charge pump, a second terminal coupled to the charge pump switch, and a control terminal coupled to the first transistor control terminal and the DAC output.

8. A method, comprising:
 providing a current from a charge pump, to a bootstrap capacitor, through a charge pump switch;
 receiving a control signal that indicates a first mode of operation or a second mode of operation;
 responsive to the control signal indicating the first mode, allowing a first value of current to the charge pump switch; and
 responsive to the control signal indicating the second mode, limiting the current to the charge pump switch to a second value, wherein the second value is less than the first value.

9. The method of claim 8, comprising driving a gate of a high-side transistor with a high-side gate driver, wherein the high-side gate driver includes a supply terminal adapted to be coupled to the bootstrap capacitor.

10. The method of claim 9, comprising, responsive to the control signal indicating the first mode:
 during a first phase:
  driving the gate of the high-side transistor to be on; and
  driving a gate of a low-side transistor to be off; and
 during a second phase:
  driving the gate of the high-side transistor to be off; and
  driving the gate of the low-side transistor to be on.

11. The method of claim 9, comprising, responsive to the control signal indicating the second mode:
 driving the gate of the high-side transistor to be off; and
 driving the gate of a low-side transistor to be off.

12. The method of claim 9, comprising closing the charge pump switch responsive to the high-side gate driver driving the gate of the high-side transistor to be on and the control signal indicating the first mode, or a voltage across the bootstrap capacitor being equal to a lower threshold and the control signal indicating the second mode.

13. The method of claim 9, comprising opening the charge pump switch responsive to the high-side gate driver driving the gate of the high-side transistor to be off and the control signal indicating the first mode, or a voltage across the bootstrap capacitor being equal to an upper threshold and the control signal indicating the second mode.

14. The method of claim 8, wherein the control signal is a digital value, the method comprising:
converting the digital value to an analog voltage; and
controlling a current through a transistor in series between the charge pump switch and the charge pump responsive to the analog value.

15. A system operable to drive an electric motor, the system comprising:
a transistor pair, including a high-side transistor and a low-side transistor, the transistor pair coupled to the electric motor; and
a gate driver circuit coupled to the transistor pair, the gate driver circuit including:
a charge pump coupled to a bootstrap capacitor and operable to supply a current having a first value to the bootstrap capacitor;
a charge pump switch coupled between the charge pump and the bootstrap capacitor; and
a current limiter coupled between the charge pump switch and the charge pump, the current limiter is operable to limit current through the charge pump switch to a value less than the first value responsive to a control signal.

16. The system of claim 15, wherein the gate driver circuit includes:
a high-side gate driver configured to drive a gate of the high-side transistor, wherein the high-side gate driver includes a supply terminal adapted to be coupled to the bootstrap capacitor; and
a low-side gate driver configured to drive a gate of the low-side transistor.

17. The system of claim 16, wherein, responsive to the control signal indicating a first mode:
during a first phase:
the high-side gate driver is configured to drive the gate of the high-side transistor to be on; and
the low-side gate driver is configured to drive the gate of the low-side transistor to be off; and
during a second phase:
the high-side gate driver is configured to drive the gate of the high-side transistor to be off; and
the low-side gate driver is configured to drive the gate of the low-side transistor to be on.

18. The system of claim 16, wherein, responsive to the control signal indicating a second mode, the high-side gate driver is configured to drive the gate of the high-side transistor to be off, and the low-side gate driver is configured to drive the gate of the low-side transistor to be off.

19. The system of claim 16, wherein the charge pump switch is configured to close:
responsive to the high-side gate driver driving the gate of the high-side transistor to be on and the control signal indicating a first mode; or
a voltage across the bootstrap capacitor being equal to a lower threshold and the control signal indicating a second mode.

20. The system of claim 16, wherein the charge pump switch is configured to open:
responsive to the high-side gate driver driving the gate of the high-side transistor to be off and the control signal indicating a first mode; or
a voltage across the bootstrap capacitor being equal to an upper threshold and the control signal indicating a second mode.

21. A device comprising:
a charge pump having an output;
a current limit circuit having first and second terminals, the first terminal coupled to the output of the charge pump;
a switch having first and second terminals, the first terminal of the switch coupled to the second terminal of the current limit circuit;
a first gate driver circuit configured to provide a gate voltage for a high-side transistor and having a first terminal coupled to the second terminal of the switch; and
a second gate driver circuit configured to provide a gate voltage for a low-side transistor.

22. A system comprising:
a high-side transistor having a gate and a terminal;
a low-side transistor having a gate and a terminal, the terminal of the low-side transistor coupled to the terminal of the high-side transistor;
a charge pump having an output;
a current limit circuit having first and second terminals, the first terminal coupled to the output of the charge pump;
a switch having first and second terminals, the first terminal of the switch coupled to the second terminal of the current limit circuit;
a first gate driver circuit having a terminal and an output, the terminal of the first gate driver circuit coupled to the second terminal of the switch, the output of the first gate driver circuit coupled to the gate of the high-side transistor; and
a second gate driver circuit having an output coupled to the gate of the low-side transistor.

23. The system of claim 22, wherein the terminal of the low-side transistor is a first terminal and the low-side transistor has a second terminal, the terminal of the first gate driver circuit is a first terminal and the first gate driver circuit has a second terminal, the second gate driver circuit has a terminal coupled to the second terminal of the low-side transistor, and further comprising:
a capacitor having first and second terminals, the first terminal of the capacitor coupled to the first terminal of the first gate driver circuit and to the second terminal of the switch, the second terminal of the capacitor coupled to second terminal of the first gate driver circuit, to the terminal of the high-side transistor, and to the first terminal of the low-side transistor.

* * * * *